United States Patent
Sugawa et al.

(10) Patent No.: US 7,197,820 B2
(45) Date of Patent: Apr. 3, 2007

(54) CIRCUIT BOARD AND ITS MANUFACTURING METHOD

(75) Inventors: Toshio Sugawa, Katano (JP); Yoshihisa Takase, Higashiosaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 147 days.

(21) Appl. No.: 10/250,871

(22) PCT Filed: Oct. 30, 2002

(86) PCT No.: PCT/JP02/11266

§ 371 (c)(1),
(2), (4) Date: Jul. 9, 2003

(87) PCT Pub. No.: WO03/043393

PCT Pub. Date: May 22, 2003

(65) Prior Publication Data

US 2004/0045738 A1    Mar. 11, 2004

(30) Foreign Application Priority Data

Nov. 12, 2001    (JP) ............................ 2001-345607

(51) Int. Cl.
H05K 3/02 (2006.01)
H01R 12/04 (2006.01)
H05K 1/11 (2006.01)
(52) U.S. Cl. .................. 29/847; 174/262; 361/792
(58) Field of Classification Search ........ 174/262–266; 361/792–795; 29/847, 853
See application file for complete search history.

(56) References Cited

U.S. PATENT DOCUMENTS

| 4,081,601 | A | * | 3/1978 | Dinella et al. | ............... 174/257 |
| 4,715,117 | A | * | 12/1987 | Enomoto | ....................... 29/851 |
| 4,893,404 | A | * | 1/1990 | Shirahata et al. | ............... 29/852 |
| 5,557,844 | A | * | 9/1996 | Bhatt et al. | .................... 29/852 |
| 5,906,042 | A | * | 5/1999 | Lan et al. | ....................... 29/852 |
| 6,217,987 | B1 | * | 4/2001 | Ono et al. | .................... 428/209 |
| 6,365,843 | B1 | * | 4/2002 | Shirai et al. | ................. 174/262 |
| 6,376,052 | B1 | * | 4/2002 | Asai et al. | ................... 428/209 |
| 6,440,542 | B1 | * | 8/2002 | Kariya | ........................ 428/209 |

(Continued)

FOREIGN PATENT DOCUMENTS

EP    0 651 602    5/1995

(Continued)

OTHER PUBLICATIONS

International Search Report corresponding to application No. PCT/JP02/11266 dated Jan. 28, 2003.

*Primary Examiner*—Tuan Dinh
*Assistant Examiner*—Jeremy C. Norris
(74) *Attorney, Agent, or Firm*—RatnerPrestia

(57) ABSTRACT

A circuit board is provided in which peeling strength is prevented from decreasing and a connection resistance to a conductive material is prevented from increasing, though the contact area decreases when the circuit board has a copper foil. This circuit board has a metal film for covering a through hole on at least one surface of an insulating substrate having the through hole filled with the conductive material. An uneven layer with a thickness of 5 μm or more is formed on a surface of the metal film, and a metal layer is formed on the opposite surface to the uneven layer.

11 Claims, 7 Drawing Sheets

U.S. PATENT DOCUMENTS

| | | | |
|---|---|---|---|
| 6,774,316 B1 * | 8/2004 | Suzuki et al. | 174/262 |
| 6,930,258 B1 * | 8/2005 | Kawasaki et al. | 174/264 |
| 2003/0132025 A1 * | 7/2003 | Wakihara et al. | 174/256 |

FOREIGN PATENT DOCUMENTS

| | | | |
|---|---|---|---|
| EP | 1075172 A1 * | 2/2001 | |
| JP | 5-275830 | 10/1993 | |
| JP | 10-56264 | 2/1998 | |
| JP | 2001-168485 | 6/2001 | |
| JP | 2001-177248 | 6/2001 | |
| JP | 2001-284797 A | 10/2001 | |

* cited by examiner

CIRCUIT BOARD AND ITS MANUFACTURING METHOD

This application is a U.S. national phase application of PCT internal application PCT/JP02/11266, filed Oct. 30, 2002.

TECHNICAL FIELD

The present invention relates to a circuit board that has a wiring layer on a sub circuit board having a wiring layer on an insulating substrate or a circuit board that has a plurality of wiring layers between sub circuit boards having a wiring layer on an insulating substrate, and to a method of manufacturing the circuit board.

BACKGROUND ART

Recently, electronic apparatuses have been downsized. There is a strong demand to inexpensive circuit board, to which a semiconductor chip such as a large-scale integrated circuit (LSI) can be mounted, for not only industrial use but also consumer use. For downsizing the circuit board by increasing mounting density, it is important that many finer wiring layers can be produced easily at high yield and high reliability. When a through hole for electrically interconnecting the wiring layers formed on both surfaces of an insulating substrate is filled and used for mounting components, the circuit board can be downsized by increasing mounting density.

In a conventional circuit board, a glass epoxy substrate formed by impregnating glass woven fabric with epoxy resin is used as the insulating substrate. A roughed copper foil is thermally pressed onto the insulating substrate, the insulating substrate is masked in a desired pattern with photosensitive resin, and then a wiring pattern is formed by photo etching. In the photo-etching, etching solution containing iron chloride or copper chloride is sprayed on the insulating substrate.

In the photo etching, a micro pattern is hardly formed because side etching occurs to make the etched pattern smaller than the photosensitive resin pattern. Therefore, the copper foil is thinned for reducing the influence of the side etching, or a copper foil having low roughness is employed for narrowing a rough part embedded into the resin in the copper foil.

When the copper foil is thinned, however, electrical resistance of the wiring increases, and time constant of an electrical characteristic increases. In this case, a circuit board having such a copper foil cannot be employed as a circuit board for high frequency use.

When a copper foil having a shallowly roughed part, namely low roughness, is embedded into the resin so that the etching period of a part having a roughed uneven layer is shortened to reduce the side etching, a contact area between the substrate and the copper foil is decreased or an anchor effect is reduced. Peeling strength therefore decreases.

When the copper foil having the low roughness is employed in a method in which the through hole is not plated but filled with conductive material, not only the peeling strength decrease but also the connecting resistance increase due to the decrease of the contact area with the conductive material. Therefore, when the copper foil having the low roughness is employed, the electrical characteristic cannot be satisfied due to formation of the micro pattern.

DISCLOSURE OF THE INVENTION

The present invention addresses the problems discussed above. In a method of the present invention, a copper foil having a roughed, highly uneven layer is employed, the uneven layer is embedded into resin, the copper foil is etched and thinned on its opposite surface to the embedded surface, and a pattern is formed by plating so as to compensate for the thinning of the copper in the pattern shape. And after a through hole is formed on an insulating substrate, the through hole is filled with conductive material. An uneven layer of a first metal film is embedded in at least one surface of the insulating substrate, and a second metal film is formed on the opposite surface of the first metal film to the uneven layer. The first metal film has a through hole, is 5 μm or less thick, and has the uneven layer of a thickness of 5 μm or more on this surface. This structure is formed in the following processes of:

adhering the uneven layer of the first metal film to at least one surface of the insulating substrate having the through hole filled with at least the conductive material;
etching the first metal film to thin it;
plating the etched surface of the first metal film with the second metal film in a desired pattern; and
etching the exposed and etched copper foil.

In other words, the uneven layer of the thickness of 5 μm or more, namely the rough part, disposed on the first metal film is embedded in the insulating substrate, so that adhesive strength of the metal films is not decreased and electrical connection of the insulating substrate to the conductive material filled into the through hole can be kept suitable. Additionally, the surface of the first metal film is etched and thinned, a micro pattern is formed by plating the surface with the second metal film and third, fourth, or fifth metal film, and then an unnecessary part of the first metal film is etched and removed using the third, fourth, or fifth metal film as a mask. The first metal film is previously thinned, so that the etching period of the unnecessary part on the first metal film for forming the micro pattern can be reduced, a side etching is reduced to facilitate easy formation of the micro wiring, substantial thickness of the wiring is increased, the resistance is decreased, and the mechanical strength is also increased.

DETAILED DESCRIPTION OF PREFERRED EMBODIMENTS

Figure 1:
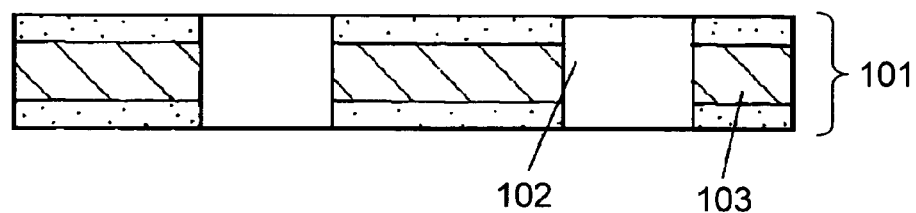
FIG. 1 is a sectional view for illustrating a method of manufacturing a circuit board in accordance with exemplary embodiment 1 of the present invention.

In a circuit board of the present invention, a first metal film has a highly uneven layer with a thickness of 5 µm or more, and the uneven layer, namely a rough part, is made to dig into a conductive material and an insulating substrate, thereby preventing decrease of peeling strength. As the contact area with the conductive material filled into a through hole increases, decrease of electric connection resistance can be prevented, and mechanical strength can be increased. The first metal film has the thickness of 5 µm or less, so that a minimum current passage required for the conduction in electroplating is secured, and the side etching can be reduced in a pattern forming process to allow a micro pattern to be formed.

In the circuit board of the present invention, third and fourth metal films used as selective etching masks for the first metal film in forming the pattern are later used as electrodes. The fourth metal film is a metal required for a metal reaction for soldering or bonding of components of the circuit board. The third metal film is effective for preventing a reaction such as diffusion to or alloying with a second metal film and the fourth metal film.

In the present invention, a circuit board having a multi-layered structure having a micro pattern is formed in the following method. A plural of sub circuit boards having the micro pattern are stacked, an insulating substrate having a desired through hole filled with the conductive material is disposed between the sub circuit boards and the sub circuit boards are bonded by thermal pressing. At this time, a wiring storing amount can be increased comparing with a conventional non-micro pattern, so that the number of layers can be reduced in the same circuitry.

When the circuitry of the present invention is applied to at least the uppermost surface of the circuit board having the multi-layered structure, component mounting density on the surface can be increased, a bare chip having a connection pad array with a micro pitch can be mounted, and a high-density circuit can be formed.

When the circuitry of the present invention is applied to at least the uppermost surface of the circuit board having the multi-layered structure, also, the third and fourth metal films used as selective etching masks for the first metal film in forming the pattern are later used as electrodes. The fourth metal film is a metal required for a metal reaction for soldering or bonding of the components of the circuit board. The third metal film is effective for preventing a reaction such as diffusion to or alloying with a second metal film and the fourth metal film. Therefore, the component mounting density on the surface can be increased, the bare chip having a connection pad array with a micro pitch can be mounted, and a high-density circuit can be formed.

No thick epoxy layer is required on the surface of the insulating substrate of the present invention, differently from the conventional glass epoxy substrate. Short circuit between wires is therefore prevented. The Short circuit has been caused by flow and movement of the conductive material filled into the through hole in adhering the first metal film.

Compression in adhering the first metal film by thermal pressing can be increased by using, as the insulating fiber, non-woven fabric having an elasticity larger than that of fabric regularly woven with warp and weft fiber yarns in the present invention. Conductive paste filled into the through hole can be tightly connected to the first metal film, thereby decreasing the electrical resistance.

Even when compressibility by the woven fabric cannot be increased, providing epoxy layers on both surfaces of the woven fabric increases compressibility. About 5 wt % or more of particulates of inorganic material such as alumina or silicon oxide are mixed into the epoxy layers, thereby preventing the conductive material filled into the through hole from flowing and moving in thermal pressing.

In the present invention, a highly uneven layer with the thickness of 5 µm or more disposed on the metal film is adhered and electrically connected to the conductive material, so that the uneven layer digs into the conductive material and contacts with more metal particles of the conductive material. Thus, electrical resistance can be decreased. The uneven layer sticks into the insulating substrate and the conductive material, thereby increasing the mechanical strength.

In a manufacturing process of a circuit board of the present invention, electroplating is employed. Although selective plating is possible by electroless plating, the growth rate is low and controllability is low. When electroplating having high growth rate is employed using the first metal film as a current passage, the growth rate can be controlled with the current density and the etching rate can be controlled with the plating film quality, namely film density. When the thickness of the first metal film is minimized within 5 µm, the etching period for forming a pattern in a subsequent process is shortened and the side etching is reduced, thereby allowing the formation of a micro pattern.

The uneven layer of the first metal film is remained as it is, the first metal film is thinned and then a pattern is formed in the present invention, so that the side etching is reduced to allow the formation of a micro pattern. At this time, the peeling strength and electric connection resistance to the insulating substrate and the conductive material filled into the through hole are not reduced. The electroless plating is employed for forming the micro pattern, thereby allowing plating growth in the independent pattern to which current is not supplied. The substantially thickness of the pattern is increased, thereby increasing the mechanical strength of the pattern and decreasing the resistance. Impedance at a high frequency is thus decreased and an advantageous characteristic for an electric circuit is obtained.

The adhesion is performed by vacuum heat pressing in the present invention, so that oxidation of metal in the conductive resin filled into the through hole can be prevented and air bubble can be released. When the insulating substrate is fused by heat, the conductive material is compressed and the highly uneven layer with the thickness of 5 µm or more can be certainly embedded in the insulating substrate without trapping the air bubble.

The first and second metal films are made of copper in the present invention, so that the resistance can be decreased similarly to the conventional circuit board. Especially, the second metal film is made of copper, so that the second metal film can be easily adhered to the first metal film by either of electroplating and electroless plating. The third, fourth, and fifth metal films have selective etching property for copper, so that the second metal film is protected when an exposed part of the first metal film is removed by etching after the plating formation. Certain pattern formation is thus allowed.

The third metal film is made of Ni in the present invention, so that the electroplating and electroless plating can be easily applied to the copper of the second metal film, and diffusion to and alloying reaction with the copper of the second metal film is prevented. Selectivity of the fourth metal film is therefore improved. The fourth metal film is made of Au, so that the fourth metal film can be used as a mask in removing an unnecessary part of the first metal film by etching. Wettability with solder can be improved and wire bonding is allowed in placing components on the circuit board. In other words, by selecting Ni and Au as the third and fourth metal films respectively, a large effect is exerted also in the manufacturing process, the removing process is not required, and the circuit board obtains a required characteristic.

Tin is used in the present invention. Tin can be easily used for plating the copper of the second metal film and easily removed with solution dissolving nitric acid in the removing process. However, using pure tin metal causes the diffusion and the alloying by heating by 50° C. or more or by dipping in the solution. Tin alloy with added Ni or Cu formed during the plating can prevent diffusion and the alloying of tin and obtain the mask effect and plating property same as those in the case of pure tin.

Circuit boards in accordance with exemplary embodiments of the present invention will be described hereinafter with reference to the accompanying drawings.

(Exemplary Embodiment 1)

In FIG. 1, so called woven fabric 103, which is woven transversely and longitudinally with yarn-like fiber of glass, Aramid, or Kevlar, is impregnated and coated with epoxy resin, thereby forming insulating substrate 101. The epoxy resin contains 5 to 50 wt % or more of alumina particles having size of 1 to 100 μm. This structure prevents metal content of conductive resin filled into a through hole from flowing during pressing, and insulating substrate 101 is different from the conventional glass epoxy substrate. Through holes (via holes) 102 are formed in insulating substrate 101 in a mechanical method using a drill. Through holes 102 can be also formed using a gas laser of carbon dioxide or YAG laser. In forming insulating substrate 101, non-woven fabric of a so called resin fiber, namely a paper-like fibril having a thickness of several mm to several mm, made of Aramid or Kevlar can be impregnated with resin of epoxy or the like. In this case, through holes 102 are easily formed with the laser, and compressibility of the resin fiber by pressing is increased thanks to the paper-like shape of the resin fiber. A resin fiber piece exists near the surface of the substrate, so that the resin fibril prevents flowing of metal particles of the conductive resin filled into through holes 102.

Figure 2:
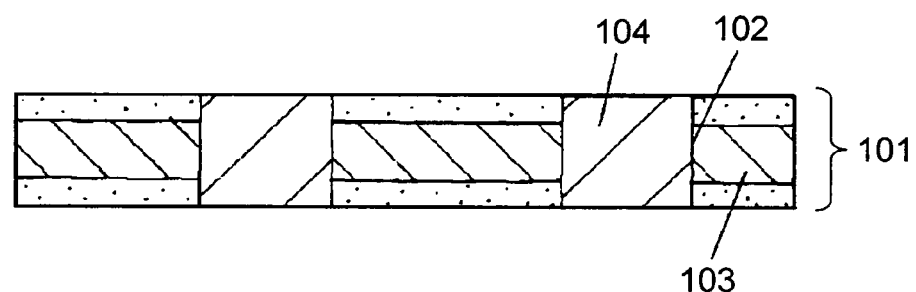
FIG. 2 is another sectional view for illustrating the method of manufacturing the circuit board in accordance with exemplary embodiment 1.

In FIG. 2, conductive paste as conductive material 104 is filled into through holes 102. The conductive paste is formed by mixing metal powder of one of copper, silver and copper coated with silver into epoxy resin or the like.

Figure 3:
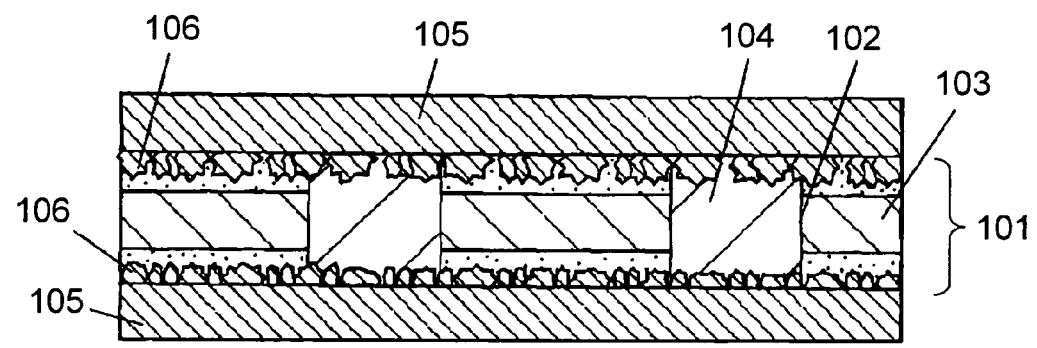
FIG. 3 is still another sectional view for illustrating the method of manufacturing the circuit board in accordance with exemplary embodiment 1.

In FIG. 3, copper foils 105 as first metal films are adhered to both surfaces of insulating substrate 101 by vacuum heat pressing so that insulating substrate 101 contains through holes 102 filled with conductive material 104. Copper foils 105 have a thickness of about 18 μm, for example. Highly uneven layer 106 as a rough layer is formed on each copper foil 105 on its insulating substrate 101 side. An adhesion area is increased, and uneven layer 106 digs into the epoxy resin of insulating substrate 101 to produce an anchor effect, thereby extremely increasing the adhesive strength.

In the non-woven fiber for preventing conductive material 104 from flowing in the present invention, the resin fibril exists near the surface of the insulating substrate, or the alumina particles or the like are mixed into the epoxy resin, as discussed above. In this case, the resin fibril and the alumina particles disturb digging of uneven layer 106 on copper foil 105, decrease the contact area with the epoxy resin, and decrease the peeling strength. Therefore, the copper foil having a moderately uneven layer cannot be employed differently from a typical glass epoxy substrate, and roughness of uneven layer 106 must be increased to the extent possible for obtaining sufficient adhesive strength. The thickness must be at least 5 μm. For manufacturing a stable circuit board, thickness of copper foil 105 must be 10 μm or more for obtaining 5 μm or thicker uneven layer 106. It is therefore extremely difficult to obtain a thin copper foil having highly uneven layer 106.

Uneven layer 106 of copper foil 105 has low electric connection resistance thanks to the increase of the contact area with the metal or the like of conductive material 104 filled into through holes 102. Uneven layer 106 has improved mechanical connection thanks to the digging into the metal as well as insulating substrate 101. Reliability of electric connection and mechanical connection is thus improved. Therefore, the higher the roughness of uneven layer 106 of copper foil 105 is, the larger the effect is. Thickness of the uneven layer must be 5 μm or more for ensuring the peeling strength of 1.4 k/Nm or more, for example.

Reliability of electric connection and the peeling strength in through holes 102 have a close relation also in a reliability test such as a heat cycle test, and the reliability increases with increasing the peeling strength. When a micro pattern is formed, however, copper foil 105 must be thinned for reducing the thinning of the pattern by the side etching. When copper foil 105 is thinned, roughness is reduced, namely uneven layer 106 is also thinned. The reduction of the adhesive strength and connection reliability is therefore caused. For obtaining sufficiently uneven layer 106, the thickness of the copper foil must be about 12 μm or more.

Figure 4:
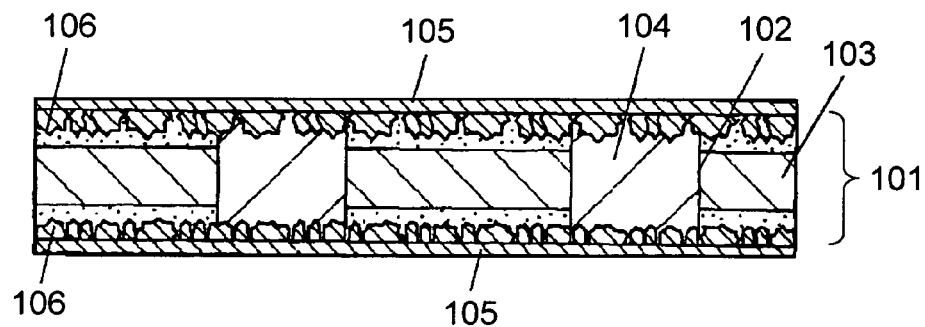
FIG. 4 is still another sectional view for illustrating the method of manufacturing the circuit board in accordance with exemplary embodiment 1.

In FIG. 4, the surface of each copper foil 105 is etched so as to minimize the thickness of copper foil 105 as long as conduction is allowed in a subsequent electroplating process. In other words, the surface of each copper foil 105 is etched to thin copper foil 105 so that the thickness other than that of uneven layer 106 is about 5 μm or less. Here, uneven layer 106 does not contribute to the conduction in the subsequent electroplating process. The required thickness of remaining copper foil 105 is the thickness for allowing the conduction in a subsequent electroplating process. Copper foil 105 thinned to the thickness requires a short etching period and can minimize the thinning by the side etching. Copper foil 105 can be thinned using the following methods:

mechanical polishing;

a combination of the mechanical polishing and chemical polishing; or chemical etching using a mixture of sulfuric acid, hydrogen peroxide solution, and water, or a mixture of ammonia, hydrogen peroxide solution, and water. Preferably, corrosion protection is not performed after the etching. In this case, subsequent plating is not disturbed.

Figure 5:
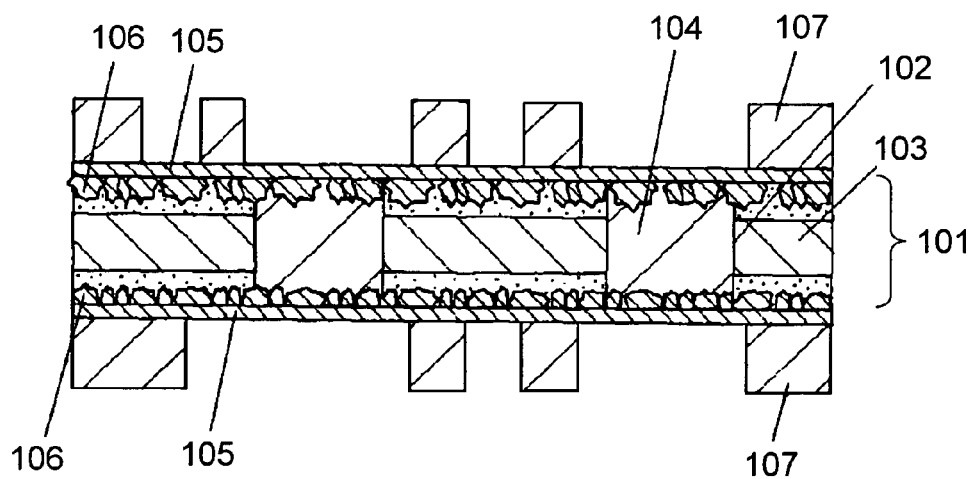
FIG. 5 is still another sectional view for illustrating the method of manufacturing the circuit board in accordance with exemplary embodiment 1.

In FIG. 5, desired resin pattern 107 is formed. Resin pattern 107 can be formed directly by a printing method such as screen-printing or by exposing and developing photosensitive resin. The thickness of resin pattern 107 preferably has the same level of that of a metal layer formed in the subsequent electroplating process, or is larger than that of the metal layer. Using the photosensitive polymer as resin pattern 107 allows relatively easy formation of even a micro pattern and formation of a nearly rectangular cross section.

Figure 6:
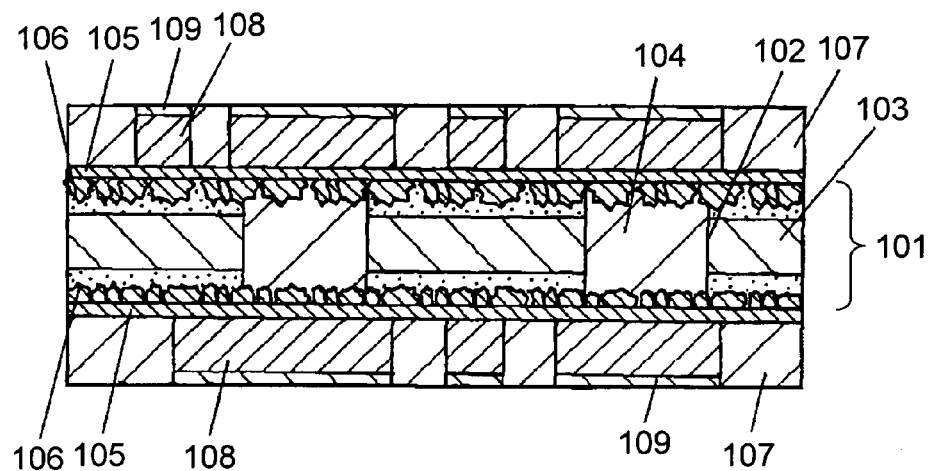
FIG. 6 is still another sectional view for illustrating the method of manufacturing the circuit board in accordance with exemplary embodiment 1.

In FIG. 6, copper 108 and tin 109 are formed on copper foil 105 by electroplating using remaining copper foil 105 as an electrode and resin pattern 107 as a mask. Copper 108 has low resistance and is easily formed on copper foil 105 by electroplating. Copper 108 is continuously plated with tin 109. The present invention is not limited to tin, but can employ the following material. The material works as a mask in etching a part of copper foil 105 not plated but exposed in the subsequent process, and has etching selectivity for copper 108 formed by electroplating. For example, the material can be nickel or chrome. The plating is formed in shape and size similar to an opening shape of resin pattern 107 in the electroplating, so that the cross section is substantially rectangular and an electric characteristic such as a high frequency characteristic is improved.

Figure 7:
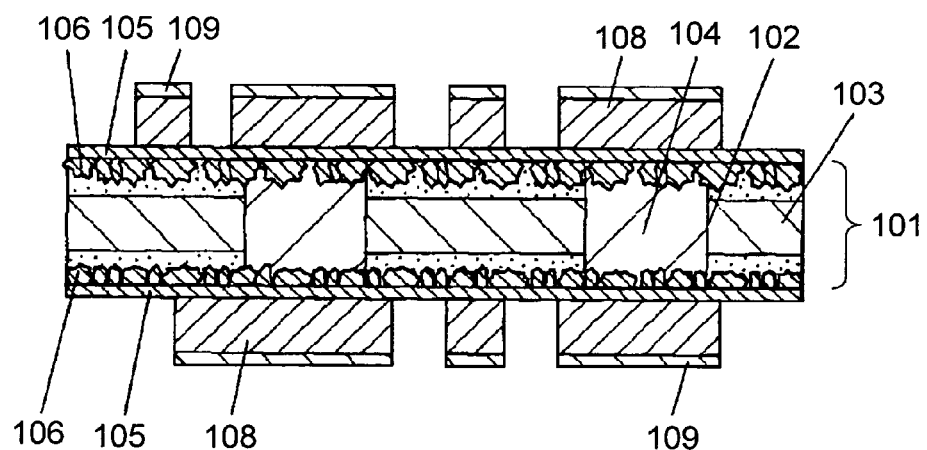
FIG. 7 is still another sectional view for illustrating the method of manufacturing the circuit board in accordance with exemplary embodiment 1.

In FIG. 7, resin pattern 107 is removed. After the removal, parts of copper foil 105 masked with resin pattern 107 and side walls of the pattern of copper 108 and tin 109 formed by electroplating are exposed. The sidewalls contact with resin pattern 107 before the removal.

Figure 8:
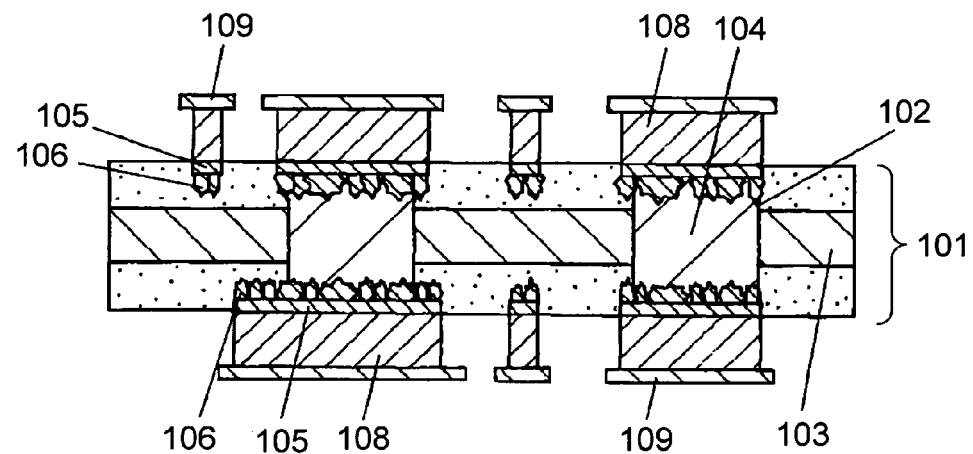
FIG. 8 is still another sectional view for illustrating the method of manufacturing the circuit board in accordance with exemplary embodiment 1.
Figure 9:
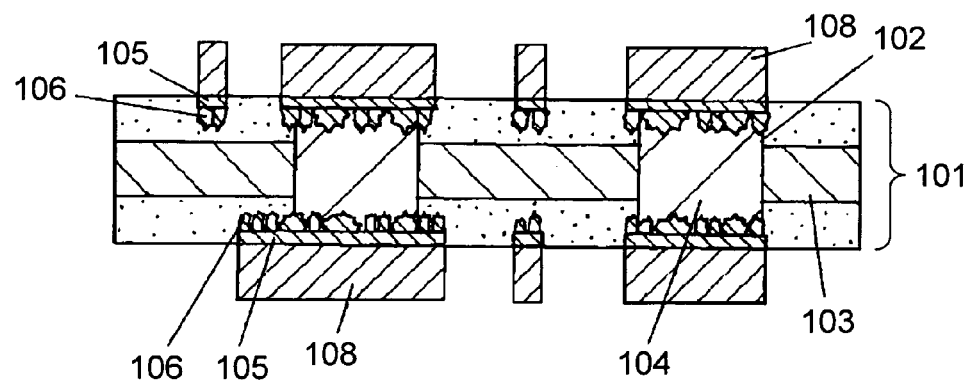
FIG. 9 is a sectional view of a completed product of the circuit board in accordance with exemplary embodiment 1.

In FIG. 8, copper foil 105 and uneven layer 106 under it in the range exposed by removing resin pattern 107 are etched. At this time, the surface of the pattern of electroplated copper 108 is not etched because the copper 108 is masked with tin 109. The pattern by electroplated copper 108 and tin 109 that has the flat surface can be formed. However, the side surfaces of copper 108 are slightly etched and hence tin 109 overhangs are formed. For reducing etching of the sidewalls, ammonia solution or sulfuric acid solution is employed as etching solution, or not a dipping type etching method but a spray type etching method is employed. Spatter etching or plasma etching also allows reduction of the etching of the sidewalls. A reverse pattern of resin pattern 107 can be accurately obtained. Copper 108 can be easily electroplated with tin 109, and contact potential difference of tin 109 with reference to copper is selectively lower than that of Ni and Zn, so that influence of electrolytic etching is small and thus suitable. However, tin dissolves in alkaline solution for removing the photosensitive resin at a temperature of 50° C. or more, adheres again, or diffuses, so that condition control is slightly difficult. For eliminating the difficulty, tin alloy in which tin 109 contains about 1% to 20% of copper or Ni is effective. Finally, tin 109 is selectively removed from the circuit board of FIG. 8 with etching solution such as nitric acid solution that does not erode copper but selectively remove only tin. Thus, the circuit board shown in FIG. 9 is completed.

(Exemplary Embodiment 2)

Figure 10:
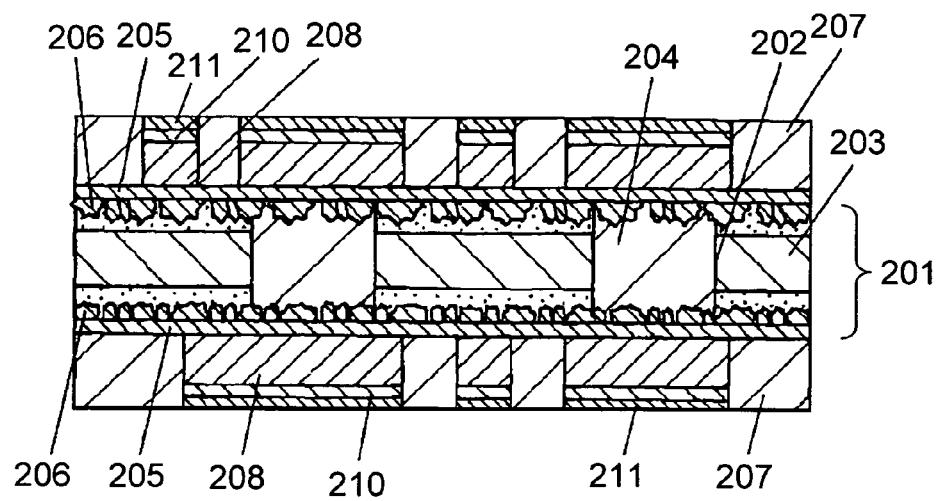
FIG. 10 is a sectional view for illustrating a method of manufacturing a circuit board in accordance with exemplary embodiment 2 of the present invention.
Figure 11:
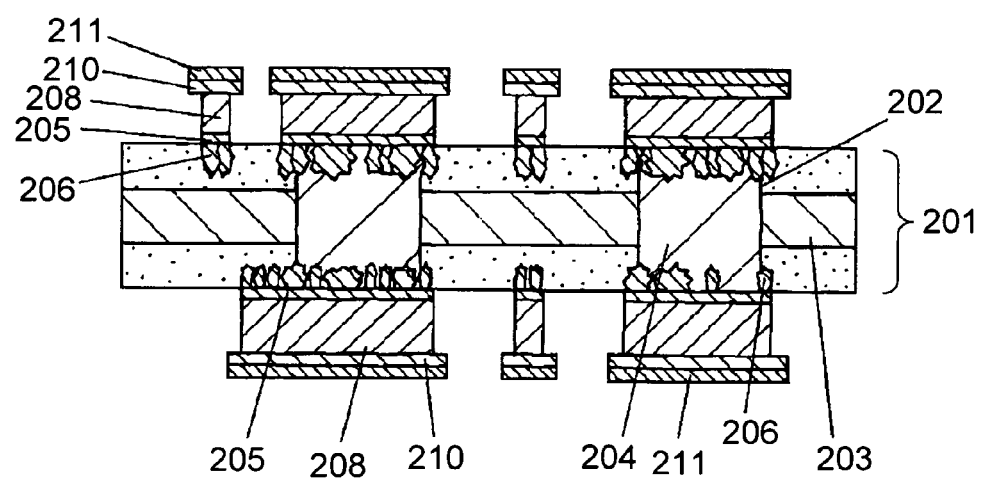
FIG. 11 is a sectional view of a completed product of the circuit board in accordance with exemplary embodiment 2.

In FIG. 10 and FIG. 11, a circuit board is manufactured in processes similar to those of embodiment 1. So called woven fabric 203, which is woven transversely and longitudinally with yarn-like fiber of glass, Aramid, or Kevlar, is impregnated and coated with epoxy resin, thereby forming insulating substrate 201. The epoxy resin contains 5 to 50 wt % more of alumina particles having size of 1 to 100 μm. This structure prevents metal content of conductive material 204 filled into a through hole from flowing during pressing, and insulating substrate 201 is different from conventional glass epoxy substrate. Through holes (via holes) 202 are formed in insulating substrate 201 in a mechanical processing using a drill. Through holes 202 can be formed also using a laser of carbon dioxide gas or YAG.

In forming insulating substrate 201, non-woven fabric of a so called resin fiber, namely a paper-like fibril having a thickness of several μm to several mm, made of Aramid or Kevlar may be impregnated with resin of epoxy or the like. In this case, through holes 202 are easily formed with the laser, and compressibility of the resin fiber by pressing is increased thanks to the paper-like shape of the resin fiber. A resin fibril exists near the surface of the substrate, so that the resin fibril can prevent flowing of metal particles of conductive material 204 filled into through holes 202.

Through holes 202 are formed in insulating substrate 201 in a mechanical processing using a drill or an optical method using the laser. Through holes 202 are filled with conductive material 204 formed by mixing powder of copper, silver, or metal having copper coated with silver into resin of epoxy or the like. Copper foil 205 having a thickness of about 18 μm is adhered to both surfaces of insulating substrate 201 by vacuum heat pressing or the like so that insulating substrate 201 contains through holes 202 filled with conductive material 204. Copper foil 205 has uneven layer 206 as a rough layer. Uneven layer 206 with a thickness of 5 μm or more on copper foil 205 digs into the epoxy resin of insulating substrate 201 and conductive material 204 filled into through holes 202. In the digging state, the surface of copper foil 205 is ground so that thickness of copper foil 205 becomes about 5 μm. This value is a minimum thickness as long as conduction is allowed in the subsequent electroplating process. Resin pattern 207 is then formed so as to form a desired pattern.

Next, the surface of copper foil 205 exposed from resin pattern 207 as a mask is electroplated sequentially with copper 208, nickel (Ni) 210, and gold (Au) 211, as shown in FIG. 10. Ni 210 and Au 211 work as masks in etching the non-plated and exposed parts of copper foil 205 in the subsequent process. Ni 210 and Au 211 in this structure are not removed differently from embodiment 1. In mounting components, Au 211 can improve solder wettability and prevent oxidation, and Ni 210 can prevent solder from diffusing to the copper. In wire bonding in mounting a semiconductor, Au 211 realizes inter-metallic bonding to a wire, and Ni 210 can effectively increase mechanical strength and prevent a metallic reaction.

Therefore, Ni 210 must have a thickness of 2 μm or more and Au 211 must have a thickness of 0.02 μm or more. Ni 210 and Au 211 may not be electroplated but electrolessplated. In FIG. 11, resin pattern 207 is then removed, and exposed copper foil 205 is removed by etching, thereby forming a circuit board. Ni 210 and Au 211 are not etched in etching copper foil 205, so that opening size is the same as that of resin pattern 207 and the wiring and electrode formation are allowed in a highly accurate surface pattern size.

(Exemplary Embodiment 3)

Figure 12:
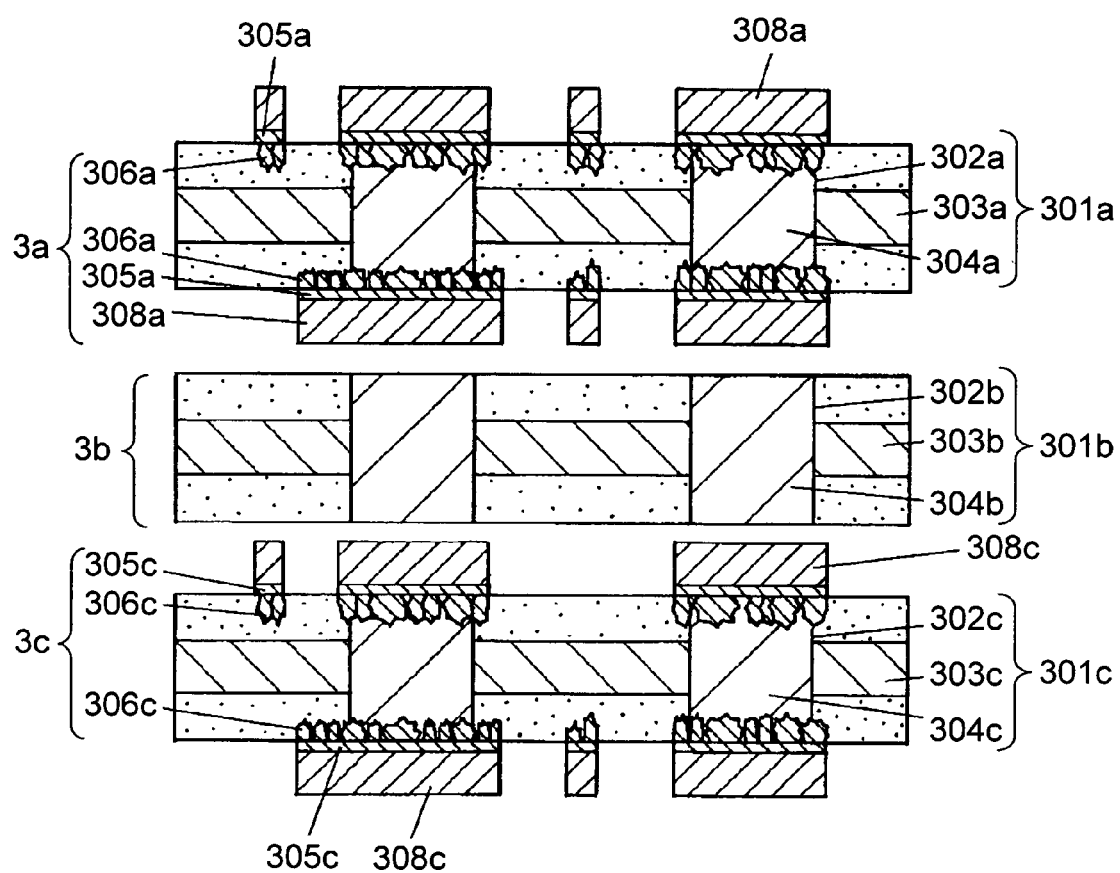
FIG. 12 is a sectional view for illustrating a method of manufacturing a circuit board in accordance with exemplary embodiment 3 of the present invention.

FIG. 12 shows circuit boards 3a, 3b, and 3c having a pattern on both surfaces manufactured in embodiment 1 of the present invention. Circuit boards 3a, 3c have insulating substrates 301a, 301c and through holes 302a, 302c, respectively. Through holes 302a, 302c are filled with conductive materials 304a, 304c, respectively. First metal films 305a, 305c are 5 μm or less thick, and have uneven layers 306a, 306c with a thickness of 5 μm or more on its at least one surface. Each of uneven layers 306a, 306c is bonded to one surface of each of insulating substrates 301a, 301c so as to include each of through holes 302a, 302c. Second metal films 308a, 308c are formed on the opposite surfaces of first metal films to uneven layers 306a, 306c, respectively. Insulating substrate 3b (301b) is disposed as an intermediate substrate between circuit boards 3a, 3c. Insulating substrate 3b (301b) has a structure similar to those of insulating substrates 301a, 301c before pressing of circuit boards 3a, 3c, and is an insulating substrate of a B stage. So called woven fabric 303b that is woven transversely and longitudinally with yarn-like fiber of glass, Aramid, or Kevlar is impregnated and coated with epoxy resin. The epoxy resin contains 5 to 50 wt % or more of alumina particles having size of 1 to 100 μm.

This structure can prevent metal powder of conductive material 304b filled into through holes 302b from flowing during pressing. Insulating substrate 301b is different from the conventional glass epoxy substrate. Through holes (via holes) 302b are formed in insulating substrate 301b in a mechanical processing using a drill. Through holes 302b can be formed also using a laser of carbon dioxide gas or YAG.

In forming insulating substrate 301b, non-woven fabric of a so called resin fiber, namely a paper-like fibril having a thickness of several μm to several mm, made of Aramid or Kevlar may be impregnated with resin of epoxy or the like. In this case, the through holes are easily formed with the laser, and compressibility of the resin fiber by pressing is increased thanks to the paper-like shape of the resin fiber. A resin fibril exists near the surface of the substrate, so that the resin fibril can prevent flowing of metal particles of the conductive material filled into the through holes.

Circuit boards 3a, 3c and circuit board 3b including conductive material 304b filled into through holes 302b are positioned with positioning pins or in an image recognizing method. Circuit boards 3a, 3b, 3c are arranged with their corresponding parts aligned, and are heated and pressed in a vacuum (vacuum heat pressing) similarly to the pressing of a copper foil. The resin in circuit board 3b of the B stage is fused by heat in the vacuum heat pressing, and upper and lower circuit boards 3a, 3c are adhered to each other while air bubble or gas is released under vacuum.

Figure 13:
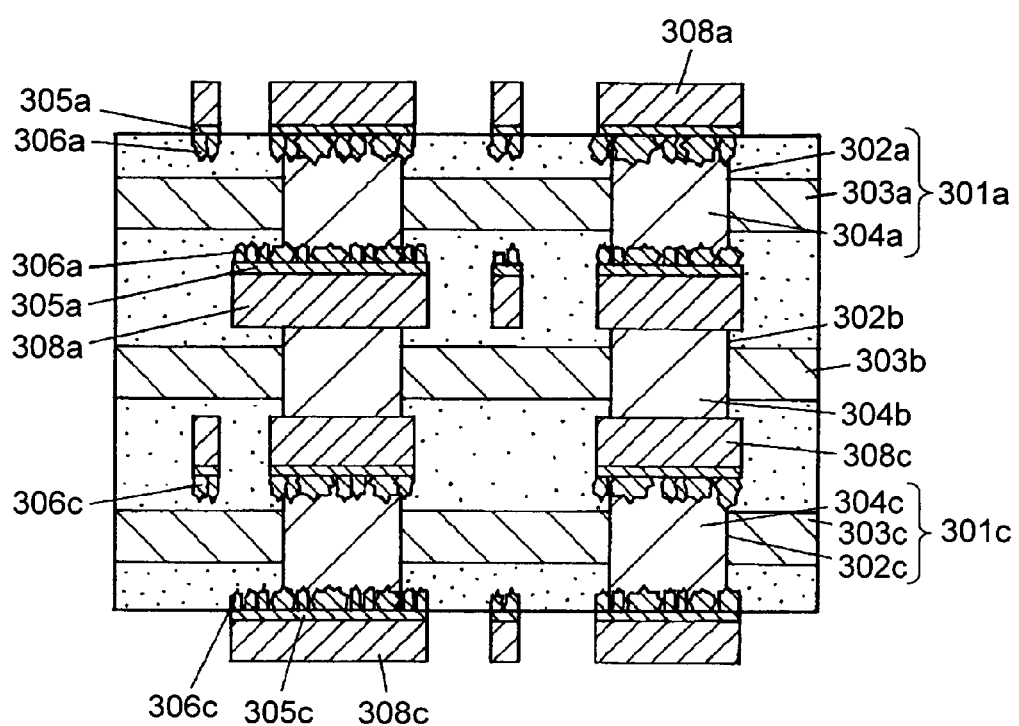
FIG. 13 is a sectional view of a completed product of the circuit board in accordance with exemplary embodiment 3.

Wiring patterns 308a, 308c of circuit boards 3a, 3c formed by plating project by their thickness size from the surfaces of insulating substrates 301a, 301c, so that conductive material 304b filled into through holes 302b in circuit board 3b is pressed with a larger pressure and therefore certainly connected. Electric connection with high reliability and low resistance can be obtained. At this pressing time, the pressure is applied also to conductive materials 304a, 304c filled into through holes 302a, 302c in insulating substrates 301a, 301c, so that the connection resistance is further decreased. Digging of uneven layers 306a, 306c of the metal foils is strengthened, so that peeling strength is increased. Thus, as shown in FIG. 13, a multi-layer wiring board having four wiring layers which are electrically connected to each other via the conductive materials filled into through holes is obtained.

In the multi-layer wiring board formed as discussed above, wiring layers 308a, 308c formed in the board are strongly connected onto conductive material 304b filled into through holes 302b in intermediate circuit board 3b. At this time, a highly uneven layer is not formed on the surfaces of wiring layers 308a, 308c formed between the substrates. In a reliability test such as a temperature cycle test, the connected parts hardly receive peeling stress and receive lateral stress. Wiring layers 308a, 308c having no highly uneven layer on their surfaces can slide laterally, so that the lateral stress can be relieved and the connection can be kept. Higher reliability can be obtained comparing with a case in which the wiring layers between the substrates are fixed by making a highly uneven layer dig into conductive material 304b.

In the embodiments of the present invention, insulating substrates before pressing are so called B-stage resin substrates that are not sufficiently hardened. Glass epoxy substrates are used as the insulating substrates in the embodiments; however, a substrate formed by impregnating, with resin, woven fabric or non-woven fabric of resin fiber of Aramid or the like can be used. The substrate formed by impregnating the non-woven fabric with resin has a special problem that a copper foil having a roughed, highly uneven layer is required for increasing peeling strength. For addressing the problem, the present invention is especially effective because it allows micro pattern formation without thinning the roughed uneven layer.

INDUSTRIAL APPLICABILITY

In a circuit board of the present invention, a micro pattern can be formed while sufficient electric connection to a conductive material filled into a through hole is kept without decreasing peeling strength. A surface of a first metal film is etched to thin the film, the micro pattern is formed with a second metal film, and then an unnecessary part of the first metal film is removed by etching. Thus, side etching is reduced comparing with a pattern etching of a copper foil to facilitate easy formation of micro wiring, substantial thickness of wiring is increased, resistance is decreased, and mechanical strength is increased. A plurality of kinds of metals are plated and selectively etched, so that the pattern shape is not damaged.

The invention claimed is:

1. A circuit board manufacturing method, comprising the steps of:
   pressurizing and adhering uneven layers of first metal films to opposite sides of an insulating substrate, the insulating substrate having a through hole filled with conductive material comprising metal particles and resin, each of said uneven layers having a thickness exceeding 5 μm on a surface of a respective one of the first metal films;
   thinning the first metal films;
   forming second metal films, respectively, on the first metal films on opposite sides of the insulating substrate in a pattern for covering at least the through hole;
   removing a part of the first metal film, the part having no second metal film;
   contacting one uneven layer with said insulating substrate on one side thereof and another uneven layer with said insulating substrate on the opposite side thereof; and
   covering, by the uneven layers, at least the conductive material on each side of the insulating substrate.

2. A circuit board manufacturing method according to claim 1, wherein
   said forming step is a step of further forming third metal films, respectively, on second metal films on opposite sides of the insulating substrate, and
   said removing step is a step of removing the third metal films after removing the first metal films.

3. A circuit board manufacturing method according to claim 2, wherein
the first metal films and the second metal films are made of copper,
the third metal films are made of metal having selective etching property for copper; and
said removing step is a step of removing the first metal films by etching.

4. A circuit board manufacturing method according to claim 3, wherein
the third metal films are made of one kind of metal selected from tin, an alloy of tin and copper, and an alloy of tin and nickel.

5. A circuit board manufacturing method according to claim 1, wherein
said forming step is a step of sequentially forming third metal films and fourth metal films, respectively, on the second metal films on opposite sides of the insulating substrate.

6. A circuit board manufacturing method according to claim 5, wherein
the first metal films and the second metal films are made of copper,
the third metal films and the fourth metal films are made of metal having selective etching property for copper, and
said removing step is a step of removing the first metal films by etching.

7. A circuit board manufacturing method according to claim 6, wherein
the third metal films are made of Ni and the fourth metal films are made of Au.

8. A circuit board manufacturing method according to claim 1, wherein
the first metal films are thinned by etching, and a part of the first metal films are thinned to a thickness of 5 μm or less, the part being other than the uneven layer.

9. A circuit board manufacturing method according to claim 1, wherein
said forming step is a step of forming metal films by electroplating.

10. A circuit board manufacturing method according to claim 1, wherein said forming step comprises steps of:
forming the first metal films in a desired pattern by photo-etching; and
forming the second metal films subsequently on the first metal films by electroless plating.

11. A circuit board manufacturing method according to claim 1, wherein
said pressurizing and adhering step is a step of pressurizing and adhering each of the uneven layers of the first metal films to at least one surface of the insulating substrate by vacuum heat pressing.

* * * * *